(12) United States Patent
Bilski (10) Patent No.: US 6,476,634 B1
(45) Date of Patent: Nov. 5, 2002

(54) ALU IMPLEMENTATION IN SINGLE PLD LOGIC CELL

(75) Inventor: Goran Bilski, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/061,571

(22) Filed: Feb. 1, 2002

(51) Int. Cl.[7] ............................. G06F 7/38; H03K 19/77
(52) U.S. Cl. ......................... 326/40; 326/38; 708/232; 708/235
(58) Field of Search ............................. 326/37, 38, 39, 326/40, 46; 708/232, 235, 700

(56) References Cited

U.S. PATENT DOCUMENTS 6,107,827 A * 8/2000 Young et al. .................. 326/41
6,157,209 A * 12/2000 McGettigan .................. 326/39

OTHER PUBLICATIONS

David A. Patterson, John L. Hennessy; *Computer Organization & Design, The Hardware/Software Interface*; Morgan Kaufmann Publishers, Inc.; Copyright 1994; Chapter 4, pp. 182–198.

Xilinx, Inc.; "Virtex–II Platform FPGA Handbook"; Copyright 1991–2000; available form Xilinx, Inc., 2100 Logic Drive, San Jose, California 95124; pp.46–54.

* cited by examiner

*Primary Examiner*—Daniel D. Chang
(74) *Attorney, Agent, or Firm*—Lois D. Cartier (57) ABSTRACT

Structures and methods that implement an ALU (Arithmetic Logic Unit) circuit in a PLD (Programmable Logic Device) while using only one PLD logic cell to implement a one-bit ALU circuit. The ALU circuit has two data input signals and two operator input signals that select between the adder, subtractor, and other logical functions. A result bit provides the result of the addition, subtraction, or other logical function as selected by the values of the two operator input signals. A carry chain is provided for combining the one-bit ALU circuits to generate multi-bit ALUs. All of this functionality is implemented in a single PLD logic cell per ALU bit.

25 Claims, 8 Drawing Sheets

ALU IMPLEMENTATION IN SINGLE PLD LOGIC CELL

FIELD OF THE INVENTION

The invention relates to Programmable Logic Devices (PLDs). More particularly, the invention relates to an ALU (Arithmetic Logic Unit) implementation for a PLD that consumes only one PLD logic cell per bit of the ALU.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g., DLLs, RAM, and so forth).

The CLBs, IOBs, interconnect, and other logic blocks are typically programmed by loading a stream of configuration data (bitstream) into internal configuration memory cells that define how the CLBs, IOBs, and interconnect are configured. The configuration data may be read from memory (e.g., an external PROM) or written into the FPGA by an external device. The collective states of the individual memory cells then determine the function of the FPGA.

Other types of PLDs are programmed using static memory, i.e., memory elements that are programmed once and retain that programming until erased or reprogrammed. These PLDs include, for example, CPLDs and antifuse devices. Other PLDs, called ASICs (Application Specific Integrated Circuits), are programmed by applying one or more customized metal layers to a previously manufactured standard base. Regardless of the type of PLD used, the configuration data used to program the device is generally provided in one or more computer programs.

Whatever the type of PLD used in a customer design, a significant benefit of programmable devices is the fact that the time required to design and implement a circuit is typically much shorter than the time required to design and manufacture a custom device. Therefore, in recent years PLD manufacturers have provided pre-designed "macros", i.e., files that include programming information to implement a particular function using some or all of the resources of a targeted PLD. Some macros are configurable, meaning that the user can select certain functions to be included, set parameters such as bit width, or select a target PLD from a list of supported PLDs. The macro program generates a configuration data file that varies depending on the information provided by the user.

Efficient use of PLD resources is important, because such efficiency can allow a user design to fit into a smaller (and less expensive) PLD. For some very large designs, inefficient resource usage can result in an implementation so large it cannot be implemented in any PLD available from a given PLD provider. Therefore, a PLD provider providing macros that more efficiently implement common user functions in its own PLDs has a marketing advantage over its competitors. Hence, efficient PLD implementations of common functions are highly desirable.

One function often used in user designs is the ALU (Arithmetic Logic Unit) function. An ALU circuit typically supports several different functions, one of which is selected using operator input signals. Supported functions can include, for example, an adder function, a subtractor function, an increment function, a decrement function, a multiplexer function, and logical functions such as AND, OR, and XOR.

Patterson and Hennessy show and describe several ALU circuits in pages 182–198 of "Computer Organization & Design: The Hardware/Software Interface", published in 1994 by Morgan Kaufmann Publishers, Inc., which pages are hereby incorporated by reference.

Typically, ALU functions are provided for a single bit (e.g., two one-bit input signals are added together) in a one-bit ALU circuit. Two or more of these one-bit circuits are then combined to provide a multi-bit ALU function. The width of an ALU circuit can be, for example, 8, 16, or 32 bits. Therefore, an efficient implementation of a one-bit ALU function is highly desirable in terms of efficiently using PLD resources.

SUMMARY OF THE INVENTION

The invention provides structures and methods that implement an ALU (Arithmetic Logic Unit) circuit in a PLD (Programmable Logic Device) while using only one PLD logic cell to implement a one-bit ALU function. The term "logic cell" is used to indicate a group of configurable logic elements including one function generator (e.g., a look-up table) and one memory storage device (e.g., a flip-flop or a latch), with supporting logic. The logic capacity of a PLD is often specified as a number of "logic cells".

The ALU circuit has two data input signals and two operator input signals that select between the adder, subtractor, and other logical functions. A result bit provides the result of the addition, subtraction, or logical function as selected by the values of the two operator input signals. A carry chain is provided for combining the one-bit ALU circuits to generate multi-bit ALUs. All of this functionality is implemented in a single PLD logic cell per ALU bit.

According to a first embodiment of the invention, an ALU circuit includes a four-input function generator, an AND gate, a carry multiplexer, and an XOR gate.

The four-input function generator has as input signals first and second data input signals and first and second operator input signals. The function generator is configured to implement an XOR function, a first multiplexer function, and a second multiplexer function. The XOR function is an XOR function of the first and second data input signals and the first operator input signal. The first multiplexer function selects between first and second logical functions of the first and second data input signals, providing a result of the first logical function when the first operator input signal is high and providing a result of the second logical function when the first operator input signal is low. The second multiplexer function selects between the XOR output signal and the first multiplexer output signal, providing the XOR output signal when the second operator input signal is high and providing the first multiplexer output signal when the second operator input signal is low. The output of the second multiplexer is coupled to the function generator output terminal.

The AND gate is coupled to the first data input terminal and the second operator input terminal of the logic cell and has an AND output terminal. The carry multiplexer has a "zero" data input terminal coupled to the AND output terminal, a "one" data input terminal coupled to the carry-in terminal of the logic cell, an output terminal coupled to the carry-out terminal of the logic cell, and a select input terminal coupled to the function generator output terminal. The XOR circuit has a first input terminal coupled to the function generator output terminal, a second input terminal coupled to the carry-in terminal, and an output terminal coupled to the result output terminal of the logic cell.

In one embodiment, the first logical function is simply the first data input signal, and the second logical function is the second data input signal. In another embodiment, the logic implemented by the function generator includes logic gates coupled between the first and second data input terminals and the first multiplexer. Thus, the first multiplexer function selects between two different logical functions of the first and second data input signals. In one embodiment, the first multiplexer selects between the AND function and the OR function of the first and second data input signals.

One PLD that can be used to implement the described circuit in a single logic cell is the Virtex™-II Field Programmable Gate Array (FPGA) provided by Xilinx, Inc. The Virtex-II CLB includes four similar slices, each including two logic cells. Each logic cell includes one four-input function generator implemented as a look-up table, as well as additional logic including at least one AND gate, multiplexer, and XOR gate. Therefore, the ALU circuit of the invention can be implemented in half of one Virtex-II slice. By concatenating the carry chains of the half-slices (i.e., by coupling the carry-out terminal of one half-slice to the carry-in terminal of another half-slice) up to eight ALU bits can be implemented in a single Virtex-II CLB.

According to another aspect of the present invention, a method is provided for configuring a PLD logic cell to implement one bit of an ALU function. The PLD logic cell includes a function generator, an AND gate, a carry multiplexer, and an XOR gate. The method includes a series of steps, which can be performed in any order. When the PLD is an FPGA, the steps are often performed simultaneously, by downloading a single bitstream (an FPGA configuration data file) into the FPGA, thereby configuring the FPGA to perform the desired functions.

According to one embodiment, the method of the invention includes configuring the function generator, configuring the AND gate functionality, configuring the carry chain functionality, and configuring the XOR gate functionality.

The function generator is configured to provide a function generator output signal. The function generator output signal is the result of a first logical function when the first operator input signal is high and the second operator input signal is low. The output signal is the result of a second logical function when the first and second operator input signals are both low. The first and second logical functions are each a function of at least one of the first and second data input signals. Finally, the output signal is an XOR function of the first and second data input signals and the first operator input signal when the second operator input signal is high.

The AND gate functionality is provided by configuring the logic cell such that the AND gate provides to the carry multiplexer an output signal comprising an AND function of the first data input signal and the second operator input signal.

The carry chain functionality is provided by configuring the logic cell such that the carry multiplexer selects between the AND gate output signal and a carry-in input signal of the logic cell. The selection is made based on the value of the function generator output signal. When the function generator output signal is low, the carry multiplexer provides the AND gate output signal. When the function generator output signal is high, the carry multiplexer provides the carry-in input signal. The selected signal is provided to a carry-out terminal of the logic cell.

The XOR functionality is provided by configuring the logic cell such that the XOR circuit performs an XOR function of the function generator output signal and the carry-in input signal, and the output of the XOR circuit provides the result output signal for the logic cell.

In one embodiment, a second logic cell is configured in a manner similar to the first logic cell. The two first operator input terminals are coupled together, and the two second operator input terminals are also coupled together, so the two logic cells perform the same function. The carry-out signal of the first logic cell is provided as the carry-in signal of the second logic cell. Thus, a two-bit ALU is formed. The chain can be extended in a similar fashion to virtually any length, with the bit-width of the ALU (i.e., the length of the carry chain) being determined by the available number of logic cells or by the operating speed required of the circuit.

According to a third aspect of the invention, a computer storage device is provided that includes configuration data for configuring a PLD logic cell to implement an ALU function. The logic cell includes a function generator, an AND gate, a carry multiplexer, and an XOR gate. The configuration data includes four sets of configuration data, which can be stored separately (i.e., in four separate files) or as a single file. If stored as a single file, the data sets can be separated out by function, or (as in the case of an FPGA) the data sets may be "mixed up" in a single configuration bitstream.

A first set of the configuration data configures the function generator to provide a function generator output signal. The function generator output signal is a result of a first logical function when a first operator input signal is high and a second operator input signal is low, a result of a second logical function when the first and second operator input signals are both low, and an XOR function of the first and second data input signals and the first operator input signal when the second operator input signal is high. The first and second functions are each a function of at least one of the first and second data input signals.

A second set of the configuration data configures the logic cell such that the AND gate provides to the carry multiplexer an output signal comprising an AND function of the first data input signal and the second operator input signal.

A third set of the configuration data configures the logic cell such that the carry multiplexer provides a carry-out signal to a carry-out terminal of the logic cell. The carry-out signal is the AND gate output signal when the function generator output signal is low, and a carry-in input signal of the logic cell when the function generator output signal is high.

A fourth set of the configuration data configures the logic cell such that the XOR circuit provides a result output signal comprising an XOR function of the function generator output signal and the carry-in input signal to a result output terminal of the logic cell.

In one embodiment, the computer storage device includes additional sets of configuration data that configure a second logic cell in a manner similar to the first logic cell. Additional sets of configuration data couple together the two first operator input terminals, and the two second operator input terminals, and (if not ensured by the PLD architecture) couple the carry-out terminal of the first logic cell to the carry-in terminal of the second logic cell.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 1:
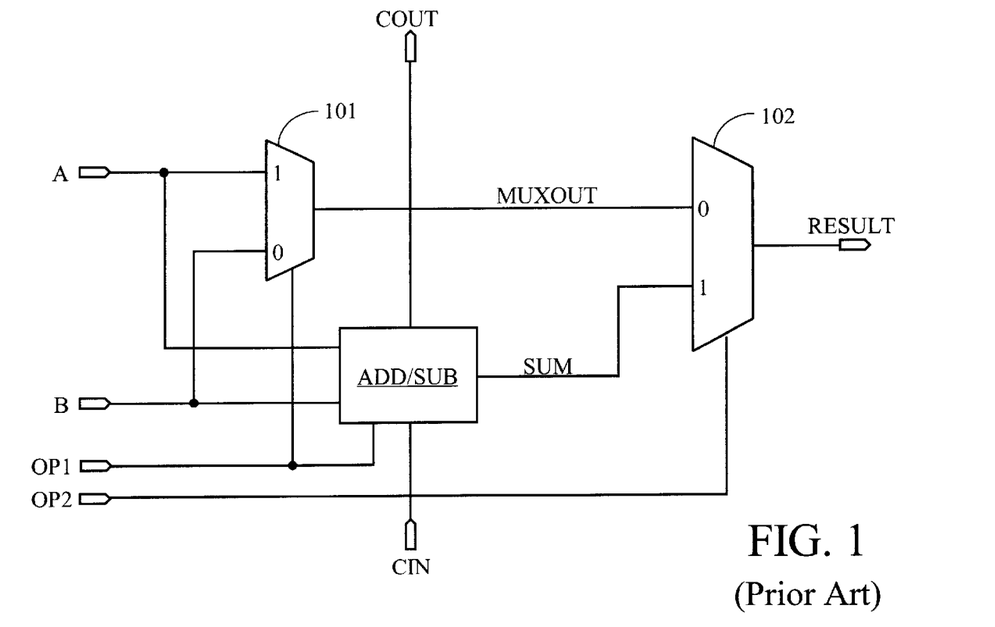
FIG. 1 shows a first prior art circuit diagram of a one-bit ALU circuit.

FIG. 1 shows a known circuit that implements a one-bit ALU. The one-bit ALU circuit accepts data input signals A and B and operator input signals OP1 and OP2. (In the present specification, the same reference characters are used to refer to terminals, signal lines, and their corresponding signals.) Depending on the values of signals OP1 and OP2, the circuit implements either an add function, a subtract function, the A function (data input signal A is passed to the RESULT output terminal), or the B function (data input signal B is passed to the RESULT output terminal).

The one-bit ALU circuit of FIG. 1 includes an adder/subtractor circuit ADD/SUB and multiplexers 101 and 102. Multiplexer 101 selects between data input signals A and B under control of operator input signal OP1, and provides output signal MUXOUT. Adder/subtractor circuit ADD/SUB adds signals A and B or subtracts signal B from signal A, as selected by operator input signal OP1, and provides the output signal SUM. A carry-in input signal CIN is also used, and a carry-out signal COUT is generated. Multiplexer 102 selects between signals MUXOUT and SUM under control of operator input signal OP2 to provide the RESULT output signal.

Adder/subtractor circuits are well known in the relevant arts. Any of several circuit implementations could be used to implement adder/subtractor ADD/SUB. Therefore, the details of this circuit are not described here.

Figure 2:
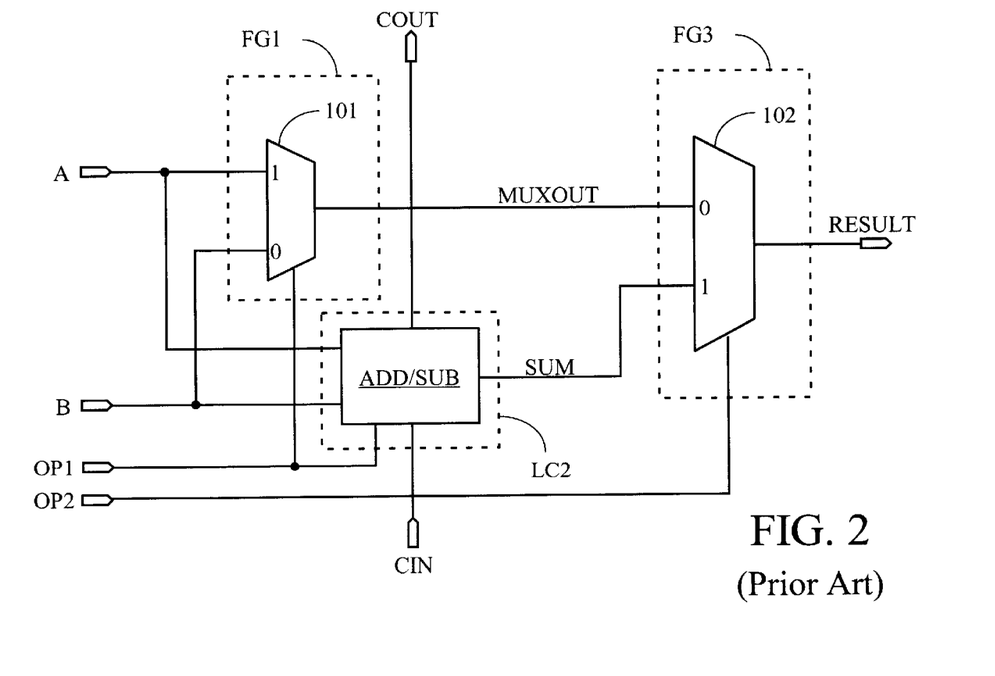
FIG. 2 shows a prior art implementation of the one-bit ALU circuit of FIG. 1, using three PLD logic cells.

FIG. 2 shows a known method for implementing the one-bit ALU circuit of FIG. 1 in a PLD. Multiplexer 101 is implemented by configuring a first function generator FG1 to implement the multiplexing function. Adder/subtractor circuit ADD/SUB can be implemented using a second function generator and the associated supporting logic (e.g., the carry chain) that is provided in the logic cells of many PLDs. Thus, adder/subtractor circuit fits into a single PLD logic cell LC2. Finally, multiplexer 102 is implemented in a third function generator. Thus it is seen that, for example, in a PLD logic cell having a function generator implemented as a 4-input look-up table, three PLD logic cells are required to implement the one-bit ALU function.

Figure 3:
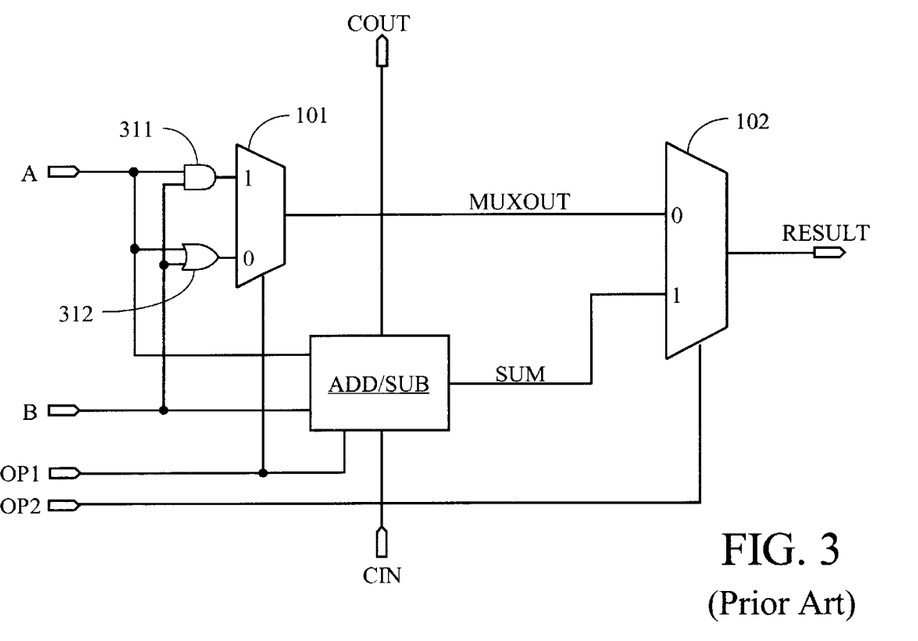
FIG. 3 shows a second prior art circuit diagram of a one-bit ALU circuit.

FIG. 3 shows another one-bit ALU circuit that provides two logical functions of A and B, rather than simply passing the A and B data input signals to the RESULT output terminal. In addition to the elements of FIG. 1, the circuit of FIG. 3 includes an AND gate 311 and an OR gate 312 that each operate on the two data input signals A and B. Thus, the one-bit ALU circuit of FIG. 3 provides the following functions: A AND B; A OR B; A–B (A minus B); and A+B (A plus B).

As described above in the section "Background of the Invention", various logical functions can be provided by an ALU circuit. Therefore, other gates can be used instead of the AND and OR gates of FIG. 3.

Figure 4:
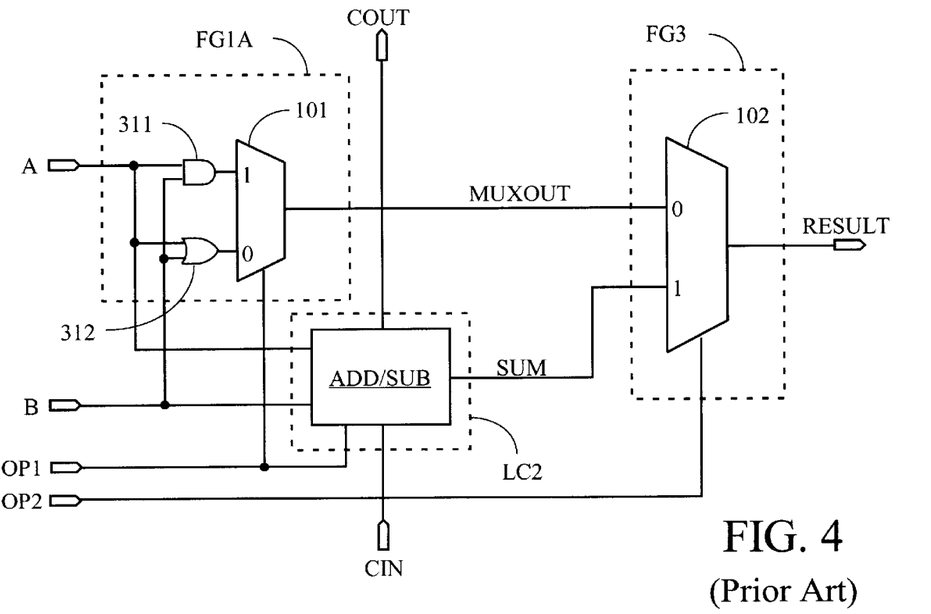
FIG. 4 shows a prior art implementation of the one-bit ALU circuit of FIG. 3, using three PLD logic cells.

FIG. 4 shows how the one-bit ALU circuit of FIG. 3 can be implemented in a PLD. Because of the flexibility of a function generator such as a 4-input look-up table, the additional logic still fits into the same function generator as the function generator logic shown in FIG. 2. In FIG. 4, this logic is shown as being implemented in function generator FG1A.

Figure 5:
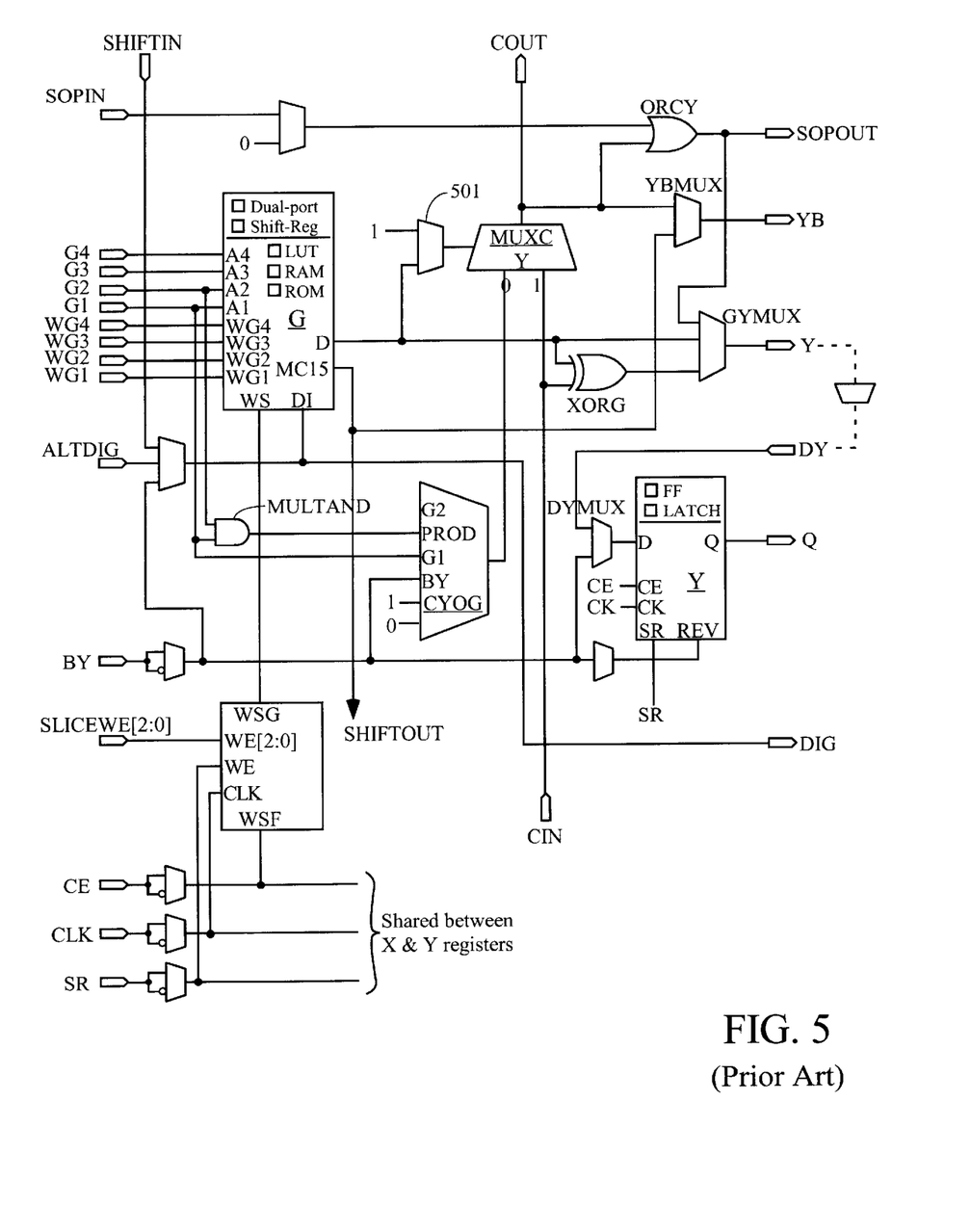
FIG. 5 is a simplified diagram of a single PLD logic cell, half of a Virtex-II slice.

FIG. 5 shows a logic cell for the Virtex-II FPGA. The drawing in FIG. 5 is based on FIG. 15 from page 47 of the "Virtex™-II Platform FPGA Handbook", published in December of 2000 and available from Xilinx, Inc. Pages 46–54 of this document, which describe the Configurable Logic Block (CLB) of the Virtex-II FPGA, are incorporated herein by reference.

The Virtex-II logic cell includes a function generator G that can be configured, among other options, as a 4-input look-up table (LUT). When configured as a 4-input look-up table, four data input signals G1–G4 are accepted and a function generator output signal is provided. The output signal can be any function of the four input signals.

A carry multiplexer MUXCY can optionally be controlled (through multiplexer 501) by the output signal from function generator G. The "0" data input to carry multiplexer MUXCY can optionally be provided (through multiplexer CYOG) by an AND gate MULTAND, which is driven by two of the data input signals of function generator G. The "1" data input of carry multiplexer MUXCY accepts a carry-in signal CIN from another logic cell. The output of carry multiplexer MUXCY is passed to yet another logic cell. Carry-in signal CIN is also provided, with the output signal from function generator G, to XOR gate XORG. The output signal from XOR gate XORG can optionally be provided, through multiplexer GYMUX, to output terminal Y of the logic cell.

Other elements shown in FIG. 5 are not relevant to the present specification. Information on these elements can be obtained from the aforementioned FPGA handbook.

Figure 6:
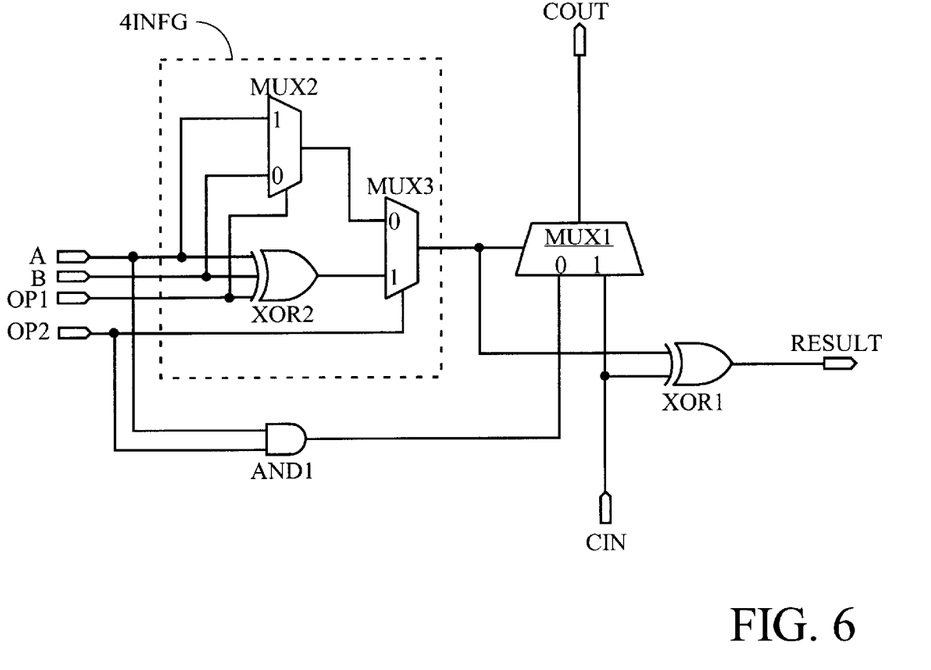
FIG. 6 shows a circuit diagram of a first one-bit ALU circuit that can be implemented in a single PLD logic cell.

FIG. 6 shows a first one-bit ALU circuit that can be implemented in a single PLD logic cell, for example in the logic cell shown in FIG. 5. This circuit is logically equivalent to the prior art circuit of FIG. 1. The one-bit ALU circuit of FIG. 6 includes an AND gate AND1, multiplexers MUX1, MUX2, and MUX3, and XOR gates XOR1 and XOR2.

Multiplexer MUX2 has a "1" data terminal driven by data input signal A and a "0" data input terminal driven by data input signal B, and drives a "0" data input terminal of multiplexer MUX3. XOR gate XOR2 is driven by input signals A, B, and OP1, and drives a "1" data input terminal of multiplexer MUX3. (Note that a 3-input XOR gate returns a high value whenever the number of high input signals is odd.) Multiplexer MUX3 provides the select signal for multiplexer MUX1, and also drives one of the input terminals of XOR gate XOR1. The other input to XOR gate XOR1 is the carry-in signal CIN, and the output signal is the circuit output signal RESULT. AND gate AND1 is driven by input signals A and OP2, and drives the "0" data terminal of multiplexer MUX1. The "1" data terminal of multiplexer MUX1 is driven by the carry-in signal CIN. Multiplexer MUX1 provides the carry-out signal for the circuit, COUT.

Table 1 shows the various functions that can be performed by the ALU circuit of FIG. 6, and the logical equations for the output signals. Tables 2–5 show the actual input and output values for each of the four functions.

As shown in Tables 1 and 2, when operator input signals OP1 and OP2 are both low and the carry-in input signal is also low, the value of input signal B is placed on the RESULT output terminal. To use this function, the carry-in input signal is set to low and the carry-out signal COUT is ignored.

As shown in Tables 1 and 3, when operator input signal OP1 is low and OP2 is high, the RESULT and COUT output terminals reflect the result of the addition of A and B.

As shown in Tables 1 and 4, when operator input signal OP1 is high and OP2 is low, the value of input signal A is placed on the RESULT output terminal. To use this function, the carry-in input signal is set to low and the carry-out signal COUT is ignored.

As shown in Tables 1 and 5, when operator input signals OP1 and OP2 are both high, the RESULT and COUT output terminals reflect the result of the subtraction of B from A. Note that the equations reflect the result of a two's-complement subtraction.

Figure 7:
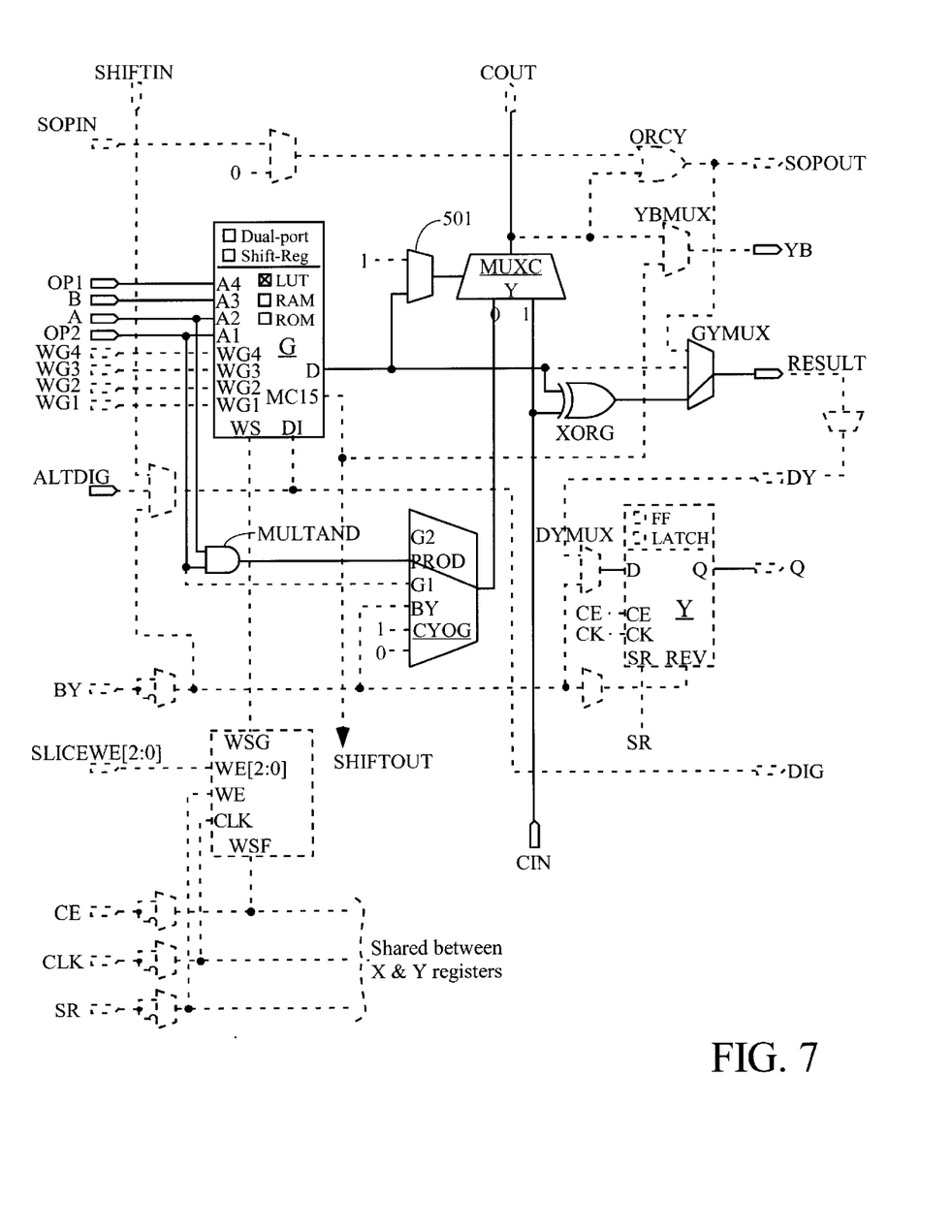
FIG. 7 shows how the one-bit ALU circuit of FIG. 6 can be implemented in the logic cell of FIG. 5.

FIG. 7 shows how the circuit of FIG. 6 can be implemented in the logic cell shown in FIG. 5. Multiplexers MUX2 and MUX3 and XOR gate XOR2 are grouped together into a small circuit (labeled 4INFG in FIG. 6) that can be implemented using a single 4-input function generator. When function generator G is configured as a 4-input lookup table, as shown in FIG. 7, the logic labeled 4INFG can be implemented in function generator G.

AND gate AND1 of the one-bit ALU circuit is implemented using AND gate MULTAND of the logic cell. The function generator input signals are assigned such that AND gate MULTAND is driven by data input signal A and operator input signal OP2.

Multiplexer CYOG is configured such that the output of AND gate MULTAND is provided to the "0" data input terminal of multiplexer MUXCY, which implements carry multiplexer MUX1 of the one-bit ALU circuit. Multiplexer 501 is configured to provide the output of function generator G to the select terminal of multiplexer MUXCY, to match the connections in the one-bit ALU circuit.

XOR gate XOR1 is implemented using XOR gate XORG of the logic cell. Multiplexer GYMUX is configured to pass the output signal from XOR gate XORG to the output terminal Y, which corresponds to the RESULT terminal of the one-bit ALU circuit.

Thus, it is seen that the one-bit ALU circuit of FIG. 6 is implemented in a single PLD logic cell. This implementation is clearly highly advantageous compared to the prior art implementation shown in FIG. 2, which consumed three PLD logic cells to provide the same logical functionality.

Figure 8:
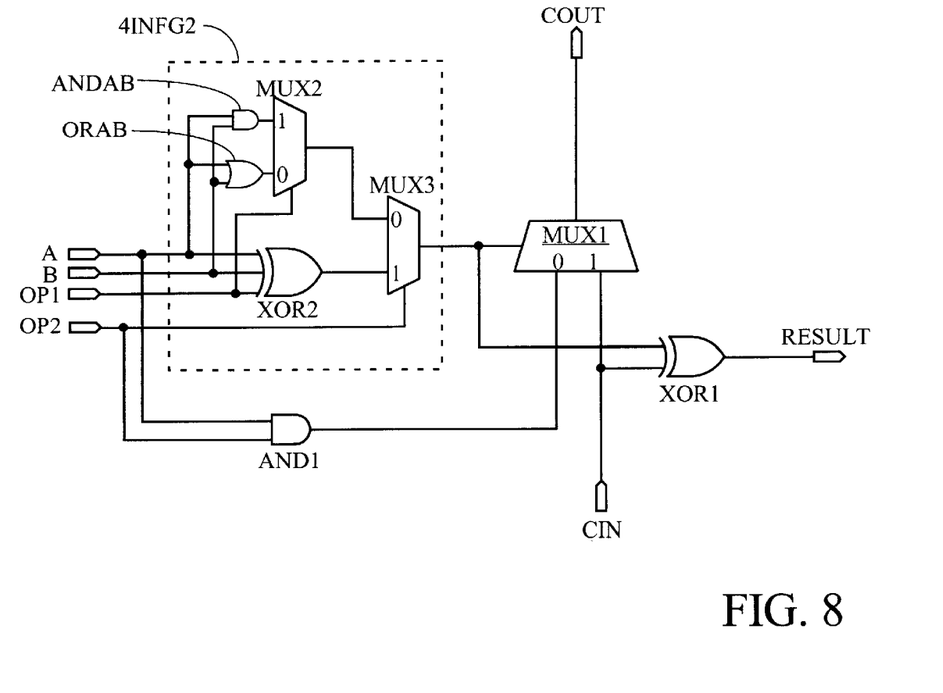
FIG. 8 shows a circuit diagram of another one-bit ALU circuit that can be implemented in a single PLD logic cell.

FIG. 8 shows another one-bit ALU circuit that can be implemented using a single PLD logic cell. This circuit is logically equivalent to the prior art circuit of FIG. 3. The one-bit ALU circuit of FIG. 8 is similar to that of FIG. 6, but includes an AND gate ANDAB and an OR gate ORAB. AND gate ANDAB is driven by data input signals A and B and drives the "1" data input terminal of multiplexer MUX2. OR gate ORAB is driven by data input signals A and B and drives the "0" data input terminal of multiplexer MUX2.

Table 6 shows the various functions that can be performed by the ALU circuit of FIG. 8, and the logical equations for the output signals. Tables similar to Tables 2–5 are easily derived for this version of the ALU by one of ordinary skill in the relevant arts. Therefore, these tables are not included here.

Because a function generator such as a 4-input lookup table can implement any function of up to four input signals, the addition of AND gate ANDAB and OR gate ORAB does not prevent the logic in small circuit 4INFG2 from being implemented in a single function generator. In fact, the one-bit ALU circuit can be altered to provide many other logic functions instead of the AND and OR function, and the resulting circuit will still fit into a single function generator. Examples include a NAND function, a NOR function, an XOR function, and an XNOR function.

Figure 9:
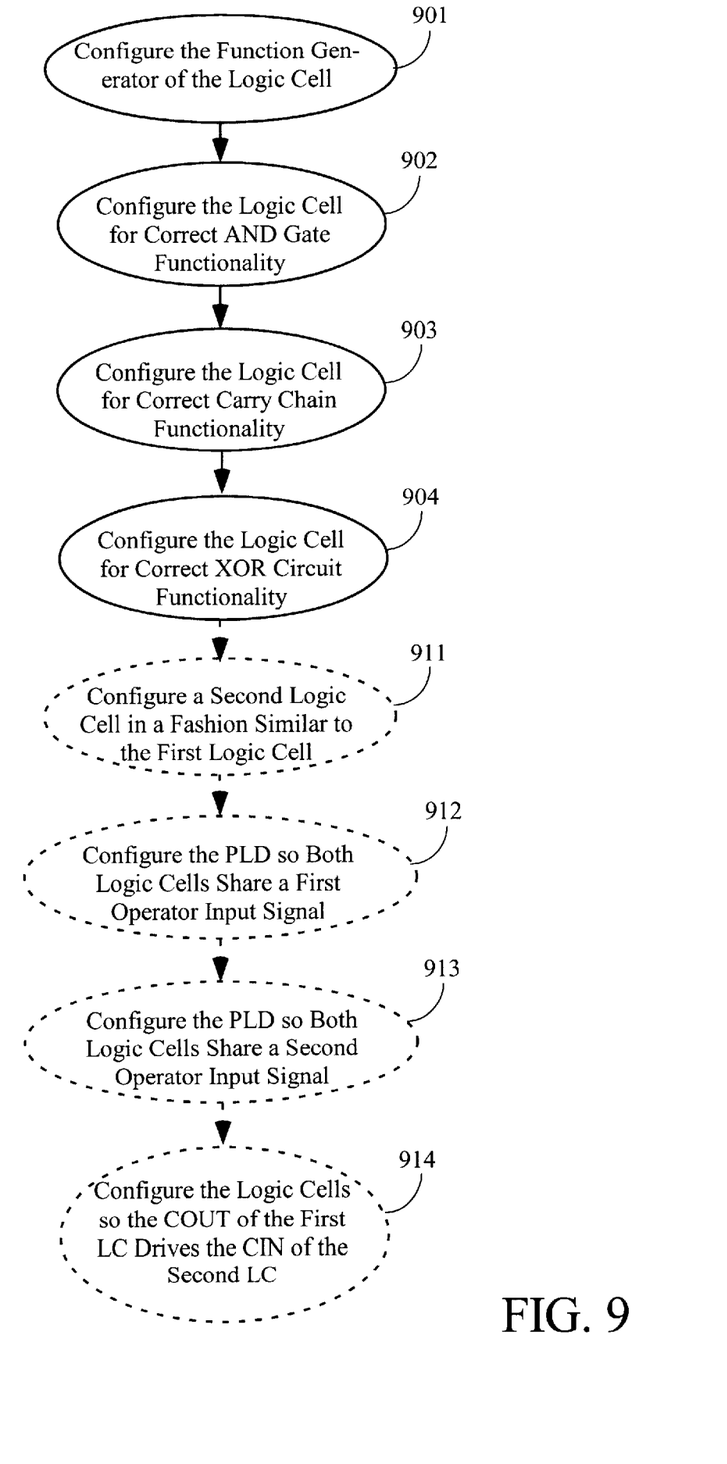
FIG. 9 is a flow chart showing a series of steps that can be followed to configure a PLD logic cell to implement a one-bit ALU circuit.

FIG. 9 shows a flow chart for configuring a PLD logic cell to implement a one-bit ALU circuit. The PLD logic cell could be, for example, the logic cell shown in FIG. 5. The one-bit ALU circuit can be, for example, one of the circuits shown in FIGS. 6 and 8, or a variation on the circuits shown in these figures. The steps of this process can be performed in any order. For example, in the case of an FPGA, where the functionality of the entire logic cell is typically determined by a single event (i.e., loading a configuration bitstream into the FPGA), the steps are essentially performed simultaneously.

In step 901, the function generator of the logic cell is configured. For example, to implement the one-bit ALU circuit of FIG. 6 in the PLD logic cell of FIG. 5 as shown in FIG. 7, function generator G is configured to implement small circuit 4INFG.

In step 902, the logic cell is configured to implement the AND gate functionality. For example, mapping AND gate AND1 of the one-bit ALU circuit to AND gate MULTAND of the logic cell of FIG. 5, multiplexer CYOG of the logic cell is configured to pass the output of AND gate MULTAND to the "0" data input of multiplexer MUXCY.

In step 903, the logic cell is configured to implement the carry multiplexer functionality. For example, mapping multiplexer MUX1 of the one-bit ALU circuit to multiplexer MUXCY of the logic cell of FIG. 5, multiplexer 501 of the logic cell is configured to pass the output of function generator G to the select input of multiplexer MUXCY.

In step 904, the logic cell is configured to implement the XOR functionality. For example, mapping XOR gate XOR1 of the one-bit ALU circuit to XOR gate XORG of the logic cell of FIG. 5, multiplexer GYMUX of the logic cell is configured to pass the output of XOR gate XORG to the output terminal Y to provide the RESULT output signal.

To generate ALU circuits with widths greater than one bit, multiple similarly-configured logic cells are used and connected using the carry multiplexers to form a carry chain. For example, FIG. 9 shows the additional optional steps to connect a second one-bit ALU circuit implementation to the first one-bit ALU circuit implemented in steps 901–904.

In step 911, a second logic cell is configured in a fashion similar to the first logic cell, i.e., steps 901–904 are repeated for the second logic cell. In step 912, the PLD routing is configured such that the first operator input signal for the two implementations is shared. In step 913, the PLD routing is configured such that the second operator input signal for the two implementations is also shared. Thus, whatever function is selected for the first one-bit ALU circuit is also applied to the second one-bit ALU circuit.

In step 914, the carry chain between the two configured logic cells is implemented. In some PLDs, this connection is made automatically by the juxtaposition of the logic cells, i.e., the connection is ensured by the PLD architecture if adjacent logic cells are used. In others, a connect must explicitly be made.

Figure 10:
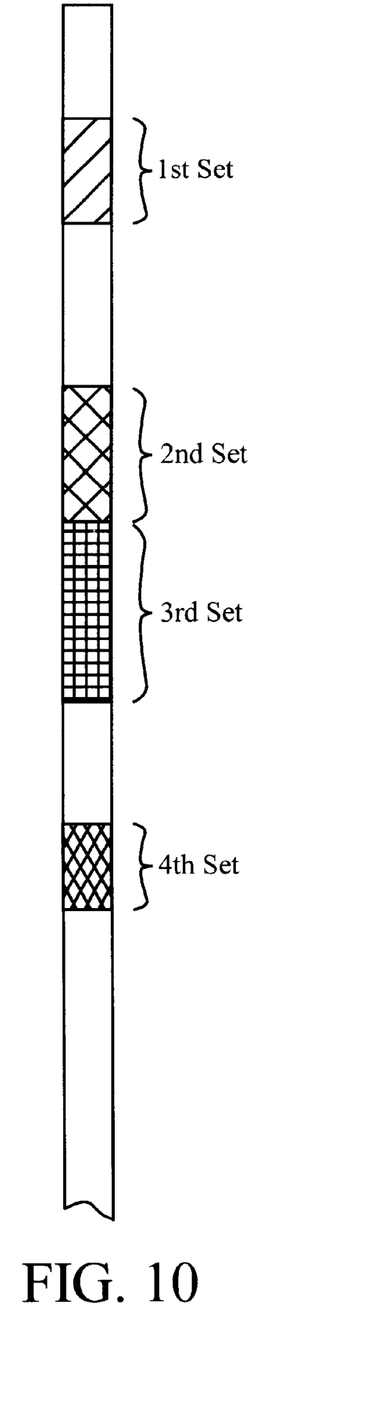
FIG. 10 is a diagram showing a first computer storage device including separate sets of data to configure a PLD logic cell to implement an ALU function.

FIG. 10 shows a first example of how configuration data to configure a PLD logic cell to implement an ALU function can be stored in a computer storage device. In this example, the configuration data for each configuration step is stored discretely, i.e., apart from the data for each of the other steps.

The first set of data (1st Set) represents the data to configure the function generator. The second set of data (2nd Set) represents the data to configure the logic cell to implement the AND gate functionality. The third set of data (3rd Set) represents the data to configure the logic cell to implement the carry multiplexer functionality. The fourth set of data (4th Set) represents the data to configure the logic cell to implement the XOR functionality. Of course, these data sets can be stored as separate files, in any order, or in any order within a single file.

Figure 11:
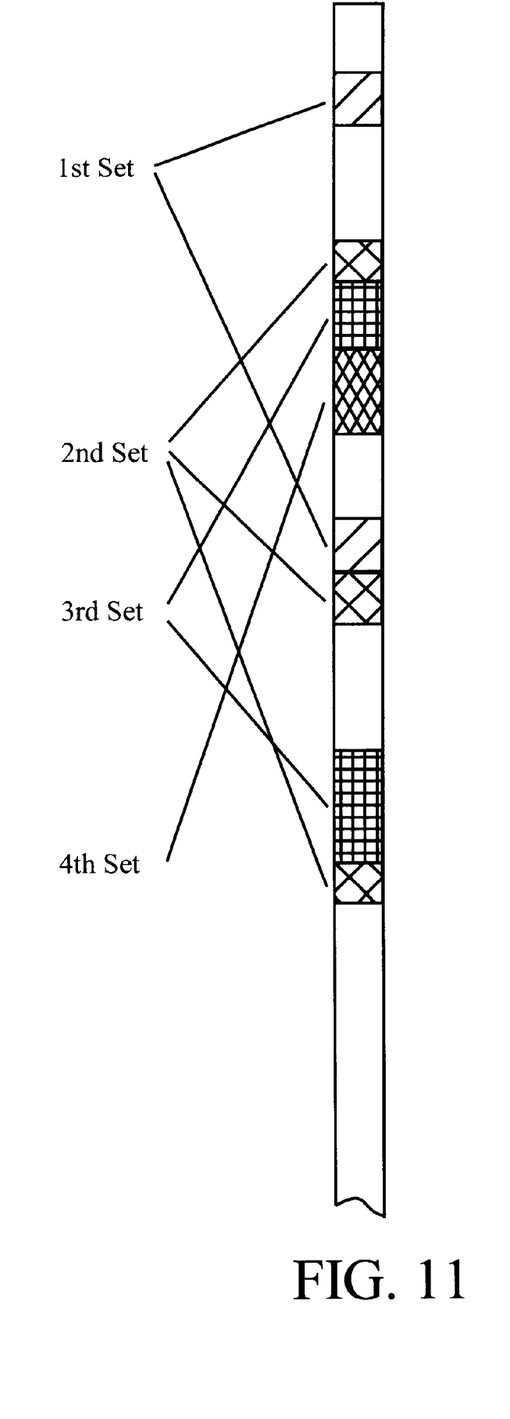
FIG. 11 is a diagram showing a first computer storage device including interleaved data to configure a PLD logic cell to implement an ALU function.

FIG. 11 shows a second example of how the configuration data to configure a PLD logic cell to implement an ALU function can be stored in a computer storage device. This example is representative of how the data is stored in an FPGA bitstream file, for example. In an FPGA, the data for a logic cell appears in an order determined by how the data will load most efficiently, and not by specific function. Therefore, the configuration bit values required to achieve the four different configurations associated with the first through fourth sets of data are likely to be interleaved with each other and with other configuration data in the configuration file. However, as the creation and interpretation of the configuration data file are automated procedures (performed in the first instance by a computer and in the second by the configuration logic on the FPGA itself), the order in which the data is stored need not be of concern to the FPGA user.

The method of the present invention may be performed in either hardware, software, or any combination thereof, as those terms are currently known in the art. In particular, the present method may be carried out by software, firmware, or microcode operating on a computer or computers of any type. Additionally, software embodying the present invention may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Furthermore, such software may also be in the form of a computer data signal embodied in a carrier wave, such as that found within the well-known Web pages transferred among computers connected to the Internet. Accordingly, the present invention is not limited to any particular platform.

Those having skill in the relevant arts of the invention will now perceive various modifications and additions that may be made as a result of the disclosure herein. For example, the above text describes the circuits and methods of the invention in the context of Field Programmable Gate Arrays (FPGAs) such as the Virtex-II FPGAs from Xilinx, Inc. However, the invention can also be applied to other PLDs and other FPGAs.

Further, function generators, look-up tables, AND gates, OR gates, XOR gates, multiplexers, ALU circuits, and PLD logic cells other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. An ALU circuit implemented in a Programmable Logic Device (PLD), the ALU circuit comprising:

first and second data input terminals providing first and second data input signals, respectively;

first and second operator input terminals providing first and second operator input signals, respectively;

a carry-in input terminal;

a carry-out output terminal;

a result output terminal;

a function generator coupled to the first and second data input terminals and the first and second operator input terminals, the function generator being configured to provide:
  an XOR function of the first and second data input signals and the first operator input signal, the XOR function providing an XOR output signal;
  a first multiplexer function of the first and second data input signals, providing a result of a first logical function to a first multiplexer output signal when the first operator input signal is high and providing a result of a second logical function to the first multiplexer output signal when the first operator input signal is low, the first and second logical functions each being functions of at least one of the first and second data input signals; and
  a second multiplexer function of the XOR output signal and the first multiplexer output signal, providing the XOR output signal to a function generator output terminal when the second operator input signal is high and providing the first multiplexer output signal to the function generator output terminal when the second operator input signal is low;

an AND gate coupled to the first data input terminal and the second operator input terminal and having an AND output terminal;

a carry multiplexer having a zero data input terminal coupled to the AND output terminal, a one data input terminal coupled to the carry-in terminal, an output terminal coupled to the carry-out terminal, and a select input terminal coupled to the function generator output terminal; and an XOR circuit having a first input terminal coupled to the function generator output terminal, a second input terminal coupled to the carry-in terminal, and an output terminal coupled to the result output terminal.

2. The ALU circuit of claim 1, wherein the function generator comprises a four-input look-up table.

3. The ALU circuit of claim 1, wherein the PLD is a Field Programmable Gate Array (FPGA).

4. The ALU circuit of claim 3, wherein the function generator is configured using an FPGA bitstream to provide the XOR function and the first and second multiplexer functions.

5. The ALU circuit of claim 1, wherein the first logical function provides the first data input signal and the second logical function provides the second data input signal.

6. The ALU circuit of claim 1, wherein the first and second logical functions are each selected from a group consisting of: an AND function, an OR function, an XOR function, a NAND function, a NOR function, and an XNOR function.

7. A method for configuring a logic cell in a Programmable Logic Device (PLD) to implement an ALU function, the logic cell comprising a function generator, an AND gate, a carry multiplexer, and an XOR gate, the method comprising:
configuring the function generator to provide a function generator output signal, the function generator output signal being a result of a first logical function when a first operator input signal is high and a second operator input signal is low, being a result of a second logical function when the first and second operator input signals are both low, and being an XOR function of first and second data input signals and the first operator input signal when the second operator input signal is high, the first and second logical functions each being a function of at least one of the first and second data input signals;
configuring the logic cell such that the AND gate provides to the carry multiplexer an output signal comprising an AND function of the first data input signal and the second operator input signal;
configuring the logic cell such that the carry multiplexer provides a carry-out signal to the carry-out terminal of the logic cell, the carry-out signal being the AND gate output signal when the function generator output signal is low and being a carry-in input signal of the logic cell when the function generator output signal is high; and
configuring the logic cell such that the XOR gate provides a result output signal comprising an XOR function of the function generator output signal and the carry-in input signal.

8. The method of claim 7, wherein the PLD comprises the logic cell and a second cell similar to the logic cell, the method further comprising:
configuring the second cell in the same fashion as the configuration of the logic cell;
configuring the PLD such that the first operator input signals of the logic cell and the second cell are the same; and
configuring the PLD such that the second operator input signals of the logic cell and the second cell are the same.

9. The method of claim 8, further comprising:
configuring at least one of the logic cell and the second cell such that the carry-out signal of the logic cell is provided as the carry-in signal of the second cell.

10. The method of claim 7, wherein configuring the function generator comprises configuring a four-input look-up table.

11. The method of claim 7, wherein the PLD is a Field Programmable Gate Array (FPGA).

12. The method of claim 11, wherein the configuring steps are all performed by downloading a single bitstream into the FPGA to provide the described functionality in the logic cell.

13. The method of claim 7, wherein the first logical function provides the first data input signal and the second logical function provides the second data input signal.

14. The method of claim 7, wherein the first and second logical functions are each selected from a group consisting of: an AND function, an OR function, an XOR function, a NAND function, a NOR function, and an XNOR function.

15. A computer storage device comprising configuration data to configure a logic cell in a Programmable Logic Device (PLD) to implement an ALU function, the logic cell comprising a function generator, an AND gate, a carry multiplexer, and an XOR gate, the configuration data comprising:
a first set of the configuration data that configures the function generator to provide a function generator output signal, the function generator output signal being a result of a first logical function when a first operator input signal is high and a second operator input signal is low, being a result of a second logical function when the first and second operator input signals are both low, and being an XOR function of the first and second data input signals and the first operator input signal when the second operator input signal is high, the first and second logic functions each being a function of at least one of the first and second data input signals;
a second set of the configuration data that configures the logic cell such that the AND gate provides to the carry multiplexer an output signal comprising an AND function of the first data input signal and the second operator input signal;
a third set of the configuration data that configures the logic cell such that the carry multiplexer provides a carry-out signal to a carry-out terminal of the logic cell, the carry-out signal being the AND gate output signal when the function generator output signal is low and being a carry-in input signal of the logic cell when the function generator output signal is high; and
a fourth set of the configuration data that configures the logic cell such that the XOR gate provides a result output signal comprising an XOR function of the function generator output signal and the carry-in input signal.

16. The computer storage device of claim 15, wherein the PLD comprises the logic cell and a second cell similar to the logic cell, the computer storage device further comprising:
a fifth set of the configuration data that configures the second cell in the same fashion as the configuration of the logic cell;
a sixth set of the configuration data that configures the PLD such that the first operator input signals of the logic cell and the second cell are the same; and
a seventh set of the configuration data that configures the PLD such that the second operator input signals of the logic cell and the second cell are the same.

17. The computer storage device of claim 16, further comprising:
an eighth set of the configuration data that configures at least one of the logic cell and the second cell such that the carry-out signal of the logic cell is provided as the carry-in signal of the second cell.

18. The computer storage device of claim 15, wherein the first, second, third, and fourth sets of the configuration data are included in a single computer file.

19. The computer storage device of claim 18, wherein the first, second, third, and fourth sets of the configuration data are interleaved in the single computer file.

20. The computer storage device of claim 15, wherein the first set of the configuration data configures a four-input look-up table to provide the function generator output signal.

21. The computer storage device of claim 15, wherein the PLD is a Field Programmable Gate Array (FPGA).

22. The computer storage device of claim 21, wherein the first, second, third, and fourth sets of the configuration data are included in a single computer file that comprises a configuration bitstream for the FPGA.

23. The computer storage device of claim 22, wherein the first, second, third, and fourth sets of the configuration data are interleaved in the configuration bitstream.

24. The computer storage device of claim 15, wherein the first logical function provides the first data input signal and the second logical function provides the second data input signal.

25. The computer storage device of claim 15, wherein the first and second logical functions are each selected from a group consisting of: an AND function, an OR function, an XOR function, a NAND function, a NOR function, and an XNOR function.

* * * * *